(12) United States Patent
Hashimoto et al.

(10) Patent No.: US 8,592,289 B2
(45) Date of Patent: Nov. 26, 2013

(54) EPITAXIAL WAFER, METHOD FOR MANUFACTURING GALLIUM NITRIDE SEMICONDUCTOR DEVICE, GALLIUM NITRIDE SEMICONDUCTOR DEVICE AND GALLIUM OXIDE WAFER

(75) Inventors: Shin Hashimoto, Itami (JP); Katsushi Akita, Itami (JP); Shinsuke Fujiwara, Itami (JP); Hideaki Nakahata, Itami (JP); Kensaku Motoki, Itami (JP)

(73) Assignees: Sumitomo Electric Industries, Ltd., Osaka-shi (JP); KOHA Co., Ltd., Tokyo (JP)

( * ) Notice: Subject to any disclaimer, the term of this patent is extended or adjusted under 35 U.S.C. 154(b) by 178 days.

(21) Appl. No.: 13/148,543

(22) PCT Filed: Feb. 4, 2010

(86) PCT No.: PCT/JP2010/051617
§ 371 (c)(1),
(2), (4) Date: Sep. 14, 2011

(87) PCT Pub. No.: WO2010/090262
PCT Pub. Date: Aug. 12, 2010

(65) Prior Publication Data
US 2011/0315998 A1  Dec. 29, 2011

(30) Foreign Application Priority Data
Feb. 9, 2009 (JP) ................ P2009-027640

(51) Int. Cl.
*H01L 21/20* (2006.01)
*H01L 21/36* (2006.01)
*C30B 23/00* (2006.01)
*C30B 25/00* (2006.01)
*C30B 28/12* (2006.01)
*C30B 28/14* (2006.01)

(52) U.S. Cl.
USPC ............ 438/478; 438/47; 438/150; 438/168; 438/187; 438/198; 257/94; 257/192; 257/256; 257/615; 117/101

(58) Field of Classification Search
None
See application file for complete search history.

(56) References Cited

U.S. PATENT DOCUMENTS

| 5,397,738 A * | 3/1995 | Takagi ..................... 117/89 |
| 8,022,436 B2 * | 9/2011 | Takeuchi et al. ............ 257/99 |
| 8,125,001 B2 * | 2/2012 | Moon ..................... 257/103 |
| 2006/0150891 A1 * | 7/2006 | Ichinose et al. .............. 117/2 |
| 2010/0176418 A1 * | 7/2010 | Muraki et al. ............ 257/103 |
| 2010/0270548 A1 * | 10/2010 | Ikemoto et al. ............. 257/43 |

FOREIGN PATENT DOCUMENTS

| JP | 03283427 A | * 12/1991 |
| JP | 2002-078246 | 3/2002 |
| JP | 2002-274997 | 9/2002 |
| JP | 2005-340308 A | 12/2005 |
| JP | 2008-156141 A | 7/2008 |
| JP | 2008-207968 | 9/2008 |
| JP | 2008-235961 A | 10/2008 |

OTHER PUBLICATIONS

Shimamura et al. "Epitaxial Growth of GaN on (1 0 0) β-$Ga_2O_3$ Substrates by Metalorganic Vapor Phase Epitaxy," Japanese Journal of Applied Physics, vol. 44, No. 1, pp. L7-L8 (2005).
Office Action in Japanese Patent Application No. 2009-027640 dated Sep. 3, 2013.

* cited by examiner

Primary Examiner — Evan Pert
Assistant Examiner — Andres Munoz
(74) Attorney, Agent, or Firm — Venable LLP; Michael A. Sartori; Tamatane J. Aga

(57) ABSTRACT

A gallium nitride based semiconductor device is provided which includes a gallium nitride based semiconductor film with a flat c-plane surface provided on a gallium oxide wafer. A light emitting diode LED includes a gallium oxide support base 32 having a primary surface 32a of monoclinic gallium oxide, and a laminate structure 33 of Group III nitride. A semiconductor mesa of the laminate structure 33 includes a low-temperature GaN buffer layer 35, an n-type GaN layer 37, an active layer 39 of a quantum well structure, and a p-type gallium nitride based semiconductor layer 37. The p-type gallium nitride based semiconductor layer 37 includes, for example, a p-type AlGaN electron block layer and a p-type GaN contact layer. The primary surface 32a of the gallium oxide support base 32 is inclined at an angle of not less than 2 degrees and not more than 4 degrees relative to a (100) plane of monoclinic gallium oxide. Owing to this inclination, the gallium nitride based semiconductor epitaxially grown on the primary surface 32a of the gallium oxide support base has a flat surface.

20 Claims, 12 Drawing Sheets

*Fig.1*
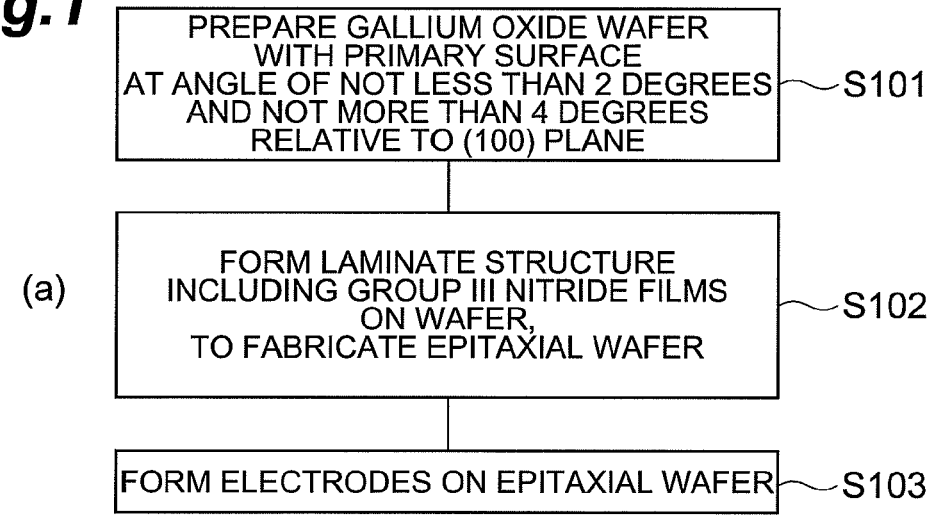
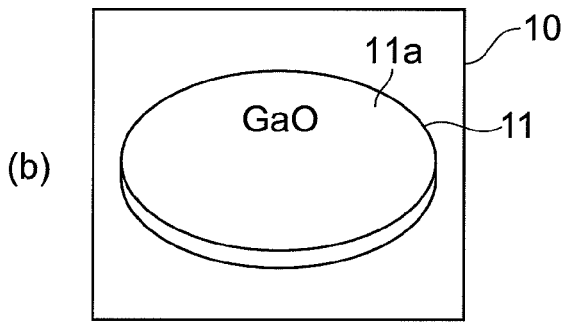
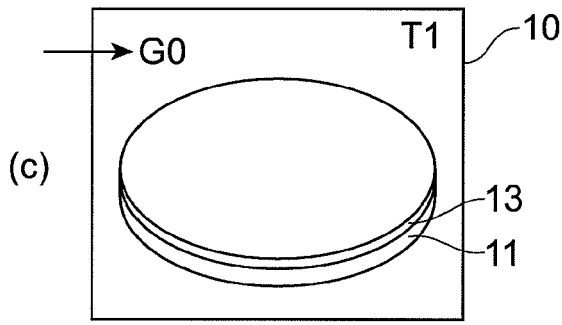
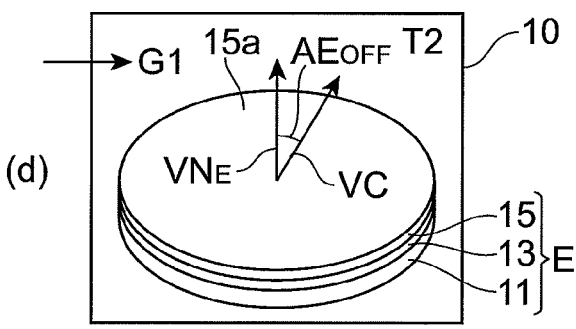

Fig.2
(a)
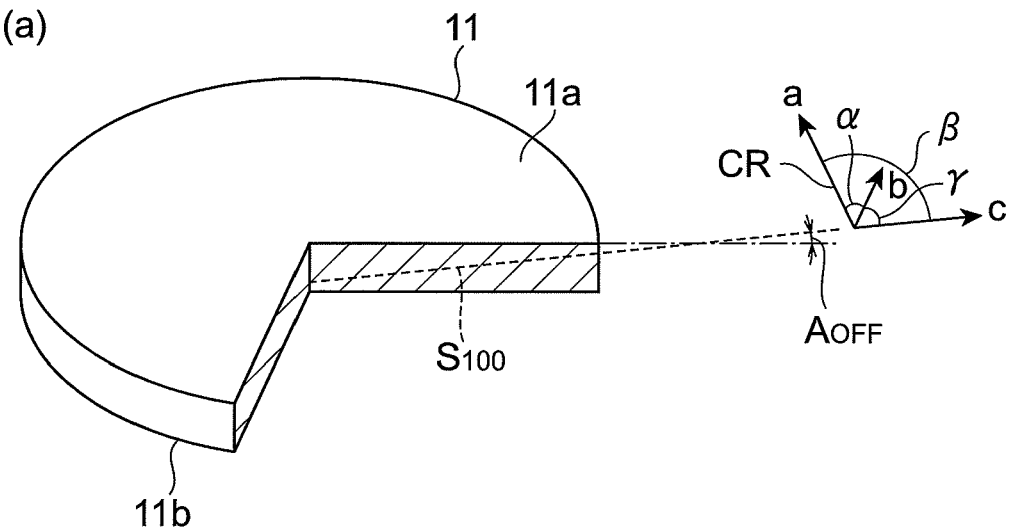
(b)
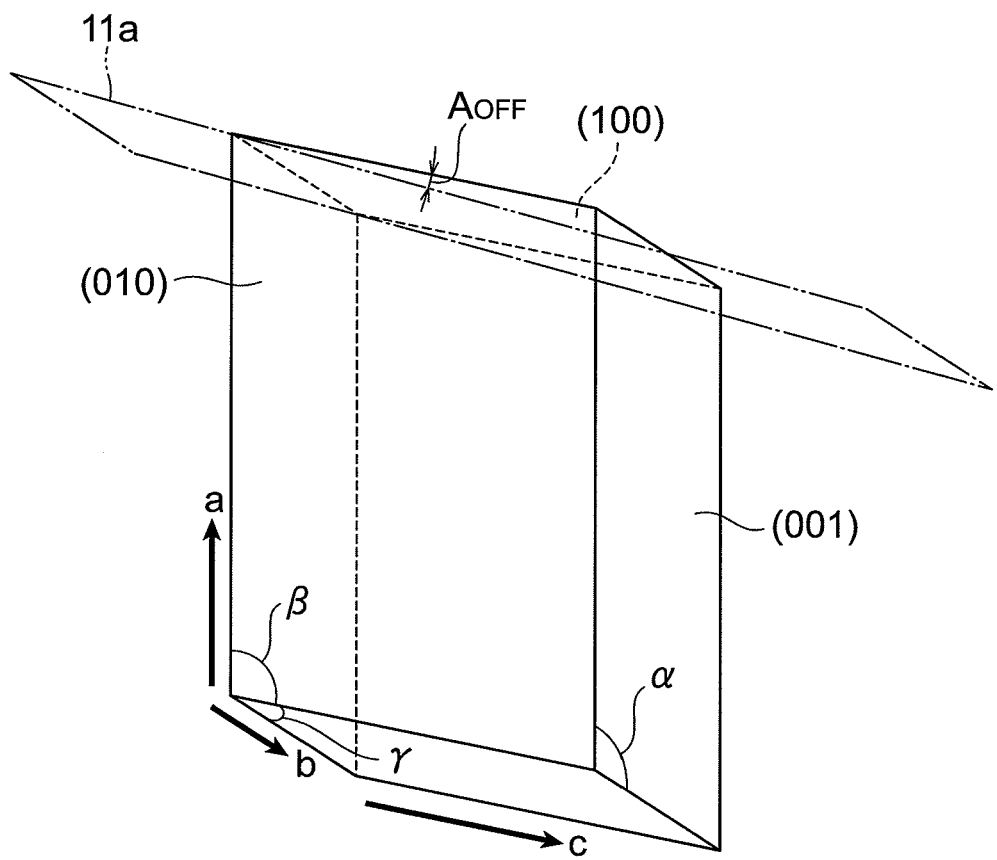

Fig.3
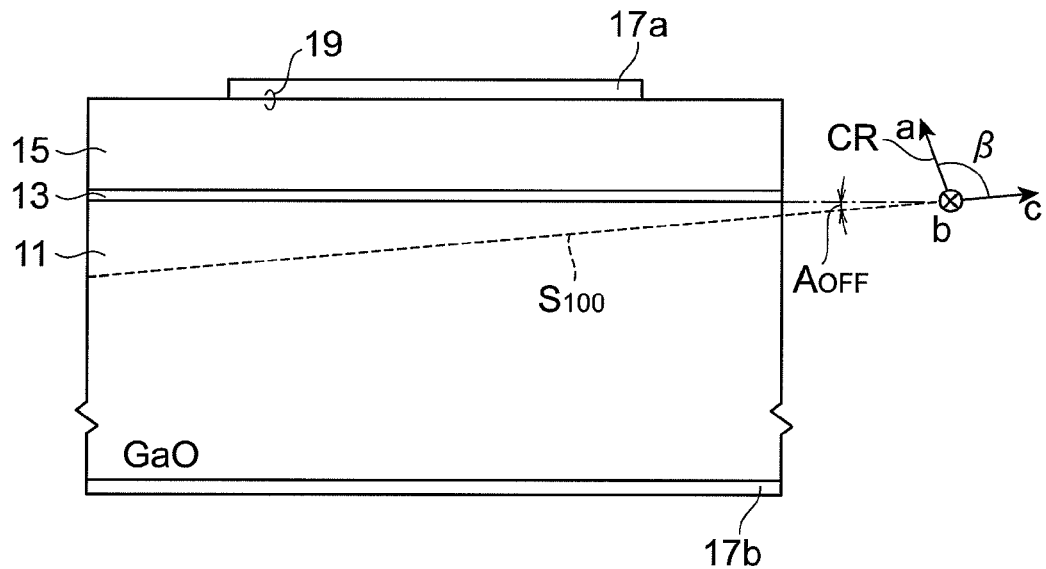
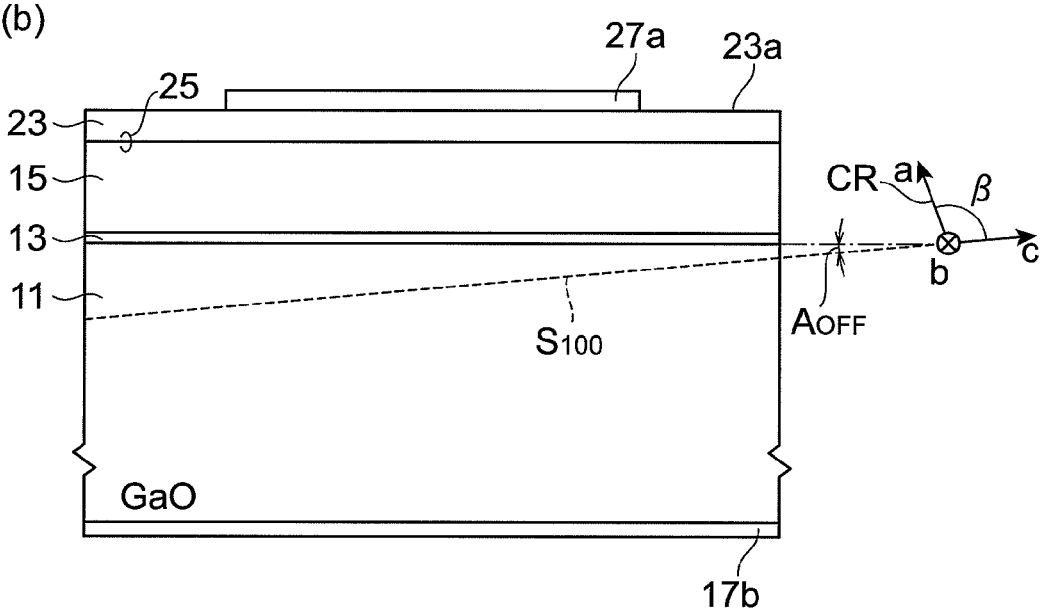

Fig.4

| Off angle (°) of gallium oxide substrate | Off angle (°) of GaN epi-layer | Max of RMS (nm) |
|---|---|---|
| 0.0 | 3.0 | ca.8 |
| 0.5 | 2.4 | ca.5 |
| 1.0 | 2.1 | ca.2 |
| 1.5 | 1.5 | 1.1 |
| 2.0 | 0.9 | 0.47 |
| 2.5 | 0.6 | 0.35 |
| 3.0 | 0.0 | 0.23 |
| 3.5 | 0.4 | 0.31 |
| 4.0 | 0.9 | 0.49 |
| 4.5 | 1.6 | 1.3 |
| 5.0 | 1.9 | ca.2 |

*Fig.8*

| Off angle (°) of gallium oxide substrate | Off angle (°) of GaN epi-layer | OPTICAL OUTPUT (mW) (with injection of 20 mA) | Max of RMS (nm) |
|---|---|---|---|
| 0.0 | 3.0 | 1.7 | ca.8 |
| 0.5 | 2.4 | 2.0 | ca.5 |
| 1.0 | 2.1 | 2.5 | ca.2 |
| 1.5 | 1.5 | 3.2 | 1.1 |
| 2.0 | 0.9 | 4.4 | 0.47 |
| 2.5 | 0.6 | 4.7 | 0.35 |
| 3.0 | 0.0 | 5.2 | 0.23 |
| 3.5 | 0.4 | 4.9 | 0.31 |
| 4.0 | 0.9 | 4.3 | 0.49 |
| 4.5 | 1.6 | 3.1 | 1.3 |
| 5.0 | 1.9 | 2.4 | ca.2 |

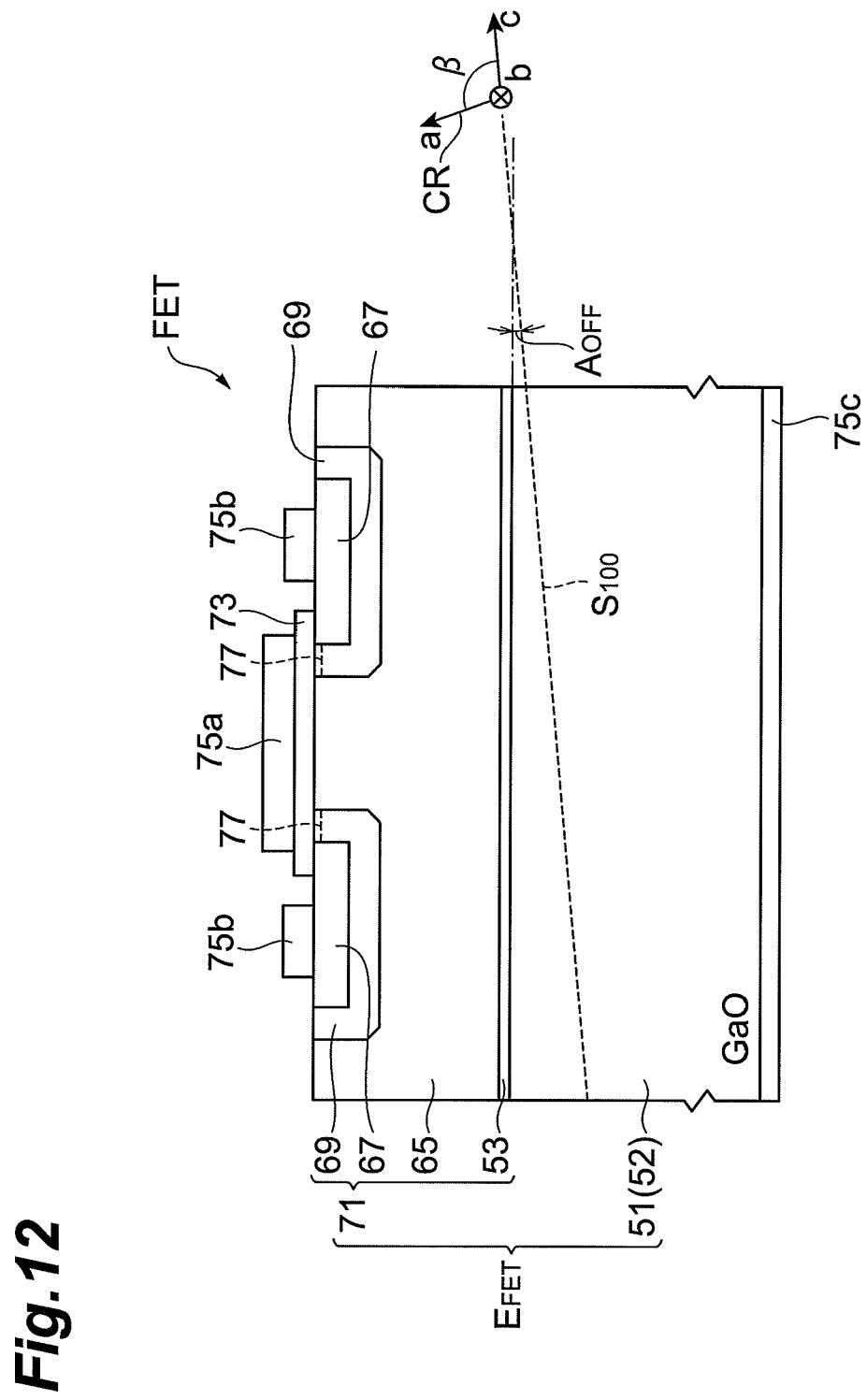

EPITAXIAL WAFER, METHOD FOR MANUFACTURING GALLIUM NITRIDE SEMICONDUCTOR DEVICE, GALLIUM NITRIDE SEMICONDUCTOR DEVICE AND GALLIUM OXIDE WAFER

TECHNICAL FIELD

The present invention relates to an epitaxial wafer, a method for fabricating a gallium nitride based semiconductor device, a gallium nitride based semiconductor device, and a gallium oxide wafer.

BACKGROUND ART

Non Patent Literature 1 describes epitaxial growth of a GaN layer on a (100) plane of a $\beta$-$Ga_2O_3$ substrate. A light emitting diode is manufactured on the (100) plane of the $\beta$-$Ga_2O_3$ substrate and this light emitting diode includes an $In_{0.12}Ga_{0.88}N/In_{0.03}Ga_{0.97}N$ multiple quantum well structure.

CITATION LIST

Non Patent Literature

Non Patent Literature 1: Kiyoshi SHIMAMURA, et al. Japanese Journal of Applied Physics, Vol. 44, No. 1, 2005, pp L7-L8

SUMMARY OF INVENTION

Technical Problem

In Non Patent Literature 1, a GaN buffer layer is grown at 600 Celsius degrees on the (100) plane of the $\beta$-$Ga_2O_3$ substrate and thereafter a GaN layer of 1000 nm thickness is grown at 1070 Celsius degrees.

Inventors' experiment has found that it is infeasible that a gallium nitride based semiconductor film is provided with a flat c-plane surface over the entire area of the $\beta$-$Ga_2O_3$ substrate by depositing gallium nitride based semiconductor onto the just (100) plane of the $\beta$-$Ga_2O_3$ substrate. For this reason, an unwanted morphology appears in the surface of the gallium nitride based semiconductor film.

It is an object of the present invention to provide an epitaxial wafer including a gallium nitride based semiconductor film with a flat surface provided on a gallium oxide wafer. It is another object of the present invention to provide a gallium nitride based semiconductor device including a gallium nitride based semiconductor film provided on a gallium oxide wafer. It is a further object of the present invention to provide a method for fabricating this gallium nitride based semiconductor device. It is still another object of the present invention to provide a gallium oxide wafer for the epitaxial wafer, the method for fabricating the gallium nitride based semiconductor device, and the gallium nitride based semiconductor device.

Solution to Problem

One aspect of the present invention is an epitaxial wafer for a gallium nitride based semiconductor device. This epitaxial wafer comprises: (a) a gallium oxide wafer with a primary surface comprising monoclinic gallium oxide; (b) a buffer layer provided on the primary surface of the gallium oxide wafer and comprising a Group III nitride; and (c) a first epitaxial layer provided on the buffer layer and comprising a first gallium nitride based semiconductor. The primary surface of the gallium oxide wafer is inclined at an angle of not less than 2 degrees and not more than 4 degrees relative to a (100) plane of the monoclinic gallium oxide.

In this epitaxial wafer, the primary surface of the gallium oxide wafer is inclined at the angle of not less than 2 degrees and not more than 4 degrees relative to the (100) plane of monoclinic gallium oxide. When a gallium nitride based semiconductor is grown on the primary surface of the gallium oxide wafer, an epitaxial layer with a flat surface is provided owing to the foregoing inclination.

The epitaxial wafer according to the present invention can be configured as follows: a direction of inclination of the primary surface of the gallium oxide wafer is a direction of the [001] axis of the monoclinic gallium oxide.

In this epitaxial wafer, since the crystal structure of gallium oxide is a monoclinic system, an epitaxial layer with an excellent morphology is provided owing to the inclination to the [001] axis.

The epitaxial wafer according to the present invention can be configured as follows: the crystal structure of the first gallium nitride based semiconductor is a hexagonal crystal, and a normal to a primary surface of the first epitaxial layer makes an angle of not more than 1 degree relative to the c-axis of the first gallium nitride based semiconductor.

In this epitaxial wafer, because of the inclination of the wafer primary surface, the surface of the epitaxial layer is provided with inclination at the angle of not more than 1 degree relative to the c-axis of the gallium nitride based semiconductor of the epitaxial layer.

The epitaxial wafer according to the present invention can be configured as follows: surface roughness (RMS) in a primary surface of the first epitaxial layer is not more than 0.5 nm in an area 5 micrometers square.

In this epitaxial wafer, flatness of the primary surface of the epitaxial layer is reduced to the surface roughness (RMS) of not more than 0.5 nm in the area 5 micrometers square.

The epitaxial wafer according to the present invention can be configured as follows: the first gallium nitride based semiconductor comprises any one of GaN, AlGaN, InGaN, and AlN. This epitaxial wafer is applicable to a gallium nitride based semiconductor device using the foregoing semiconductor.

The epitaxial wafer according to the present invention can be configured as follows: the buffer layer may be made of GaN. This epitaxial wafer allows a binary Group III nitride semiconductor such as GaN to be used as a material of the buffer layer.

The epitaxial wafer according to the present invention can be configured as follows: the angle of inclination is distributed in the primary surface of the gallium oxide substrate and is in the angle range of not less than 2 degrees and not more than 4 degrees over the entire primary surface of the gallium oxide substrate.

In this epitaxial wafer, the epitaxial film with an excellent morphology is provided throughout the entire primary surface of the wafer.

The epitaxial wafer according to the present invention can be configured as follows: the primary surface of the gallium oxide wafer is inclined at the angle of not less than 2.5 degrees and not more than 3.5 degrees relative to the (100) plane of the monoclinic gallium oxide.

With this epitaxial wafer, we can obtain the primary surface of the epitaxial layer with higher flatness.

Another aspect of the present invention relates to a gallium nitride based semiconductor device. This gallium nitride based semiconductor device comprises: (a) a gallium oxide support base with a primary surface comprised of monoclinic gallium oxide; and (b) a laminate structure comprised of Group III nitrides. The laminate structure comprises a buffer layer provided on the primary surface of the gallium oxide support base and comprised of a Group III nitride, and a first epitaxial layer provided on the buffer layer and comprised of a first gallium nitride based semiconductor. The primary surface of the gallium oxide wafer is inclined at an angle of not less than 2 degrees and not more than 4 degrees relative to a (100) plane of the monoclinic gallium oxide.

This gallium nitride based semiconductor device comprises the laminate structure provided on the gallium oxide support base. When the laminate structure is formed on the gallium oxide support base with the primary surface inclined at the foregoing angle, this inclination allows the epitaxial layer with a flat surface to grow thereon. The growth on the primary surface inclined at the foregoing angle prevents he characteristics of the gallium nitride based semiconductor device from being troubled by poor flatness of the epitaxial surface.

The gallium nitride based semiconductor device of the present invention is configured as follows: the laminate structure further comprises a second epitaxial layer which is provided on the buffer layer and comprises a second gallium nitride based semiconductor, and an active layer which is provided between the first epitaxial layer and the second epitaxial layer; the gallium oxide wafer has conductivity; the first epitaxial layer has first type conductivity; the second epitaxial layer has second type conductivity opposite to the first type conductivity; the active layer has a quantum well structure; the gallium nitride based semiconductor device comprises a semiconductor light emitting device.

This gallium nitride based semiconductor device includes the laminate structure for a light emitting device provided on the gallium oxide support base. This structure can prevent the characteristics of the gallium nitride based semiconductor device from being troubled by poor flatness of the epitaxial surface, thereby providing the gallium nitride based semiconductor light emitting device with excellent characteristics.

The gallium nitride based semiconductor device of the present invention is configured as follows: the laminate structure further comprises a second epitaxial layer provided on the gallium oxide wafer; the second epitaxial layer makes a heterojunction with the first epitaxial layer; a bandgap of the second gallium nitride based semiconductor is larger than a bandgap of the first gallium nitride based semiconductor; the heterojunction creates a two-dimensional electron gas at an interface between the first epitaxial layer and the second epitaxial layer; the gallium nitride based semiconductor device includes a two-dimensional electron gas transistor.

This gallium nitride based semiconductor device includes the laminate structure for the two-dimensional electron gas transistor provided on the gallium oxide support base. This can prevent the characteristics of the gallium nitride based semiconductor device from being troubled by poor flatness of the epitaxial surface, thus providing the two-dimensional electron gas transistor with excellent characteristics.

The gallium nitride based semiconductor device of the present invention can further comprise: a source region comprising a gallium nitride based semiconductor region of a first type conductivity; and a well region comprising a gallium nitride based semiconductor region of a second type conductivity and isolating the source region from the first epitaxial layer; the gallium oxide wafer has conductivity; the first epitaxial layer has the first type conductivity; the gallium nitride based semiconductor device includes a vertical field effect transistor.

This gallium nitride based semiconductor device comprises the structure for the vertical field effect transistor provided on the gallium oxide support base. This structure can prevent the characteristics of the gallium nitride based semiconductor device from being troubled by poor flatness of the epitaxial surface, thus providing the vertical field effect transistor with excellent characteristics.

The gallium nitride based semiconductor device of the present invention can be configured as follows: surface roughness (RMS) in a primary surface of an uppermost layer of the laminate structure is not more than 0.5 nm in an area 5 micrometers square.

In this gallium nitride based semiconductor device, the primary surface of the epitaxial layer exhibits excellent flatness.

Still another aspect of the present invention relates to a method for fabricating a gallium nitride based semiconductor device. This method can comprise the steps of: (a) preparing a gallium oxide wafer with a primary surface comprised of monoclinic gallium oxide; (b) growing a buffer layer of a Group III nitride on the primary surface of the gallium oxide wafer; and (c) growing a first epitaxial layer of a first gallium nitride based semiconductor on the buffer layer. The primary surface of the gallium oxide wafer is inclined at an angle of not less than 2 degrees and not more than 4 degrees relative to a (100) plane of the monoclinic gallium oxide.

In this method, the primary surface of the gallium oxide wafer is inclined at the angle of not less than 2 degrees and not more than 4 degrees with respect to the (100) plane of monoclinic gallium oxide. The epitaxial layer with a flat surface is provided owing to this inclination. The inclination prevents the characteristics of the gallium nitride based semiconductor device from being troubled by poor flatness of the epitaxial surface.

The method according to the present invention can be configured as follows: a growth temperature of the buffer layer is not less than 400 Celsius degrees and not more than 600 Celsius degrees.

Still another aspect of the present invention relates to a gallium oxide wafer with a primary surface which comprises monoclinic gallium oxide, and the primary surface of the gallium oxide wafer is inclined at an angle of not less than 2 degrees and not more than 4 degrees relative to a (100) plane of the monoclinic gallium oxide.

In this gallium oxide wafer, the primary surface of the gallium oxide wafer is inclined at the angle of not less than 2 degrees and not more than 4 degrees relative to the (100) plane of monoclinic gallium oxide. A gallium nitride based semiconductor epitaxially grown on the primary surface of the gallium oxide wafer has a flat surface owing to this inclination.

In still another aspect of the present invention, a direction of inclination of the primary surface of the gallium oxide wafer can be a direction of the [001] axis of the monoclinic gallium oxide.

In this gallium oxide wafer, since the crystal structure of gallium oxide is a monoclinic system, the inclination to the [001] axis can provides an epitaxial layer with an excellent morphology.

The above objects and other objects, features, and advantages of the present invention will more readily become clear from the following detailed description of the preferred embodiments of the present invention with reference to the accompanying drawings.

Advantageous Effects of Invention

As described above, one aspect of the present invention provides the epitaxial wafer including the gallium nitride based semiconductor film with the flat surface provided on the gallium oxide wafer. Another aspect of the present invention provides the gallium nitride based semiconductor device including the gallium nitride based semiconductor film provided on the gallium oxide wafer. Furthermore, still another aspect of the present invention provides the method for fabricating the gallium nitride based semiconductor device. In addition, still another aspect of the present invention provides the gallium oxide wafer for the epitaxial wafer, the gallium nitride based semiconductor device, and the method for fabricating the epitaxial wafer and the gallium nitride based semiconductor device.

BRIEF DESCRIPTION OF DRAWINGS

FIG. 1 is a drawing showing major steps of a method for fabricating a gallium nitride based semiconductor device and an epitaxial wafer according to an embodiment of the present invention.

FIG. 2 is a drawing showing a monoclinic gallium oxide wafer and the crystal lattice of monoclinic gallium oxide.

FIG. 3 is a drawing schematically showing gallium nitride based semiconductor devices fabricated by steps S101 to S103.

FIG. 4 is a drawing showing a relation of inclination angles (off angles) of substrate primary surfaces of gallium oxide substrates and morphologies of surfaces of GaN epitaxial films.

FIG. 8 is a drawing showing a relation of off angles of primary surfaces of gallium oxide substrates with surface roughnesses and off angles of semiconductor layers as underlying layers for growth of an active layer and with light outputs of LED structures.

FIG. 12 is a drawing schematically showing the vertical field effect transistor and the epitaxial wafer fabricated according to the step flow of FIG. 11.

DESCRIPTION OF EMBODIMENTS

Figure 5:
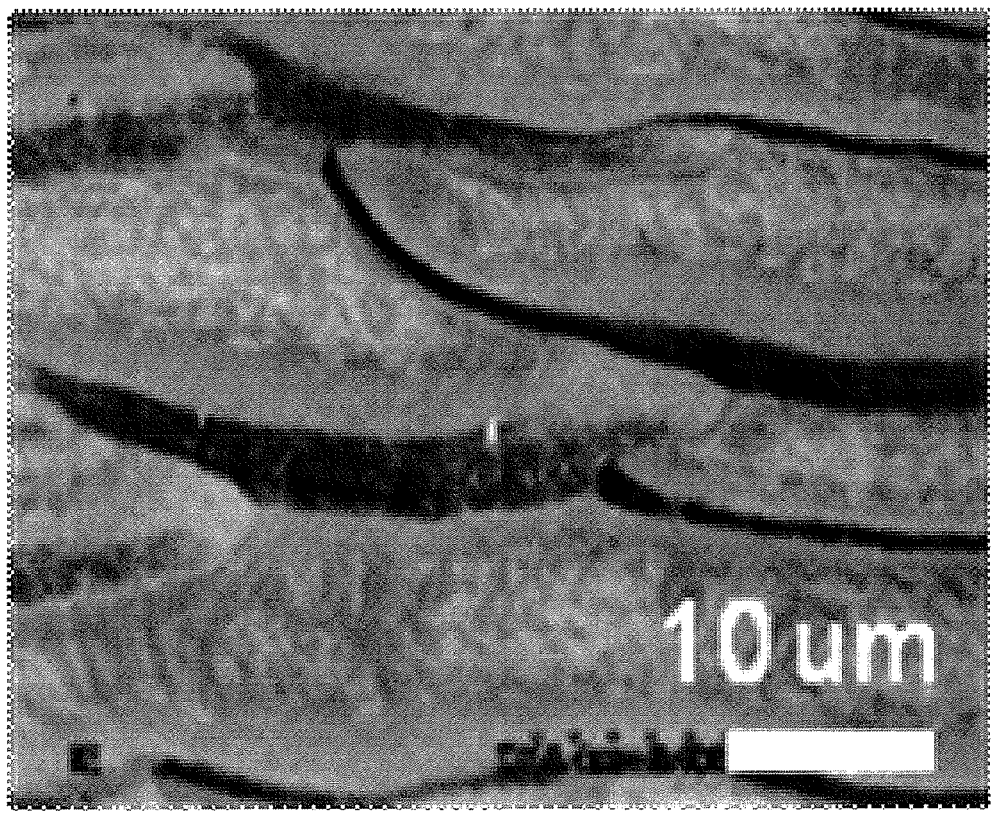
FIG. 5 is a drawing showing a scanning electron microscope image indicating a surface of an epitaxial wafer using a gallium oxide substrate with an off axis of zero.

The expertise of the present invention can be readily understood in view of the following detailed description with reference to the accompanying drawings presented by way of examples. The below will describe embodiments of the epitaxial wafer, the gallium nitride based semiconductor device, the method for fabricating the gallium nitride based semiconductor device and the epitaxial wafer, and the gallium oxide wafer according to the present invention, with reference to the accompanying drawings. The same portions will be denoted by the same reference signs as much as possible.

FIG. 1 is a drawing showing major steps of a method for fabricating a gallium nitride based semiconductor device and an epitaxial wafer according to an embodiment of the present invention. In the step flow shown in FIG. 1 (a), step S101 is to prepare a gallium oxide wafer 11 with a primary surface which comprises monoclinic gallium oxide. Referring to FIG. 2 (a), the gallium oxide wafer 11 is shown. This wafer 11 comprises, for example, a β-$Ga_2O_3$ single crystal. The wafer 11 includes a primary surface 11a and a back surface 11b, and the primary surface 11a and the back surface 11b are parallel to each other. The primary surface 11a of the wafer 11 is inclined at an angle $A_{OFF}$ of not less than 2 degrees and not more than 4 degrees with respect to a (100) plane of monoclinic gallium oxide.

In this gallium oxide wafer 11, the primary surface 11a of the wafer 11 is inclined at the angle of not less than 2 degrees and not more than 4 degrees relative to the (100) plane of monoclinic gallium oxide. Owing to this inclination, a gallium nitride based semiconductor epitaxially grown on the primary surface 11a of the gallium oxide wafer comes to have a flat surface.

The angle $A_{OFF}$ of the primary surface of the gallium oxide wafer can be distributed throughout the entire primary surface 11a. The surface of the gallium nitride based semiconductor epitaxially grown on the primary surface 11a of the gallium oxide wafer has a good morphology throughout the entire area of the primary surface 11a of the wafer.

Referring to FIG. 2 (a), a typical (100) plane $S_{100}$ and a crystal coordinate system CR, and the crystal coordinate system CR has the a-axis, b-axis, and c-axis are depicted, and the typical (100) plane $S_{100}$ is inclined relative to the primary surface 11a of the wafer 11. With reference to FIG. 2 (b), the crystal lattice of monoclinic gallium oxide is shown. The lattice constants of the a-axis, b-axis, and c-axis of the crystal lattice of monoclinic gallium oxide are 1.223 nm, 0.304 mm, and 0.58 mm, respectively. Vectors Va, Vb, and Vc represent directions of the a-axis, b-axis, and c-axis, respectively. The vectors Va and Vb define the (001) plane, the vectors Vb, Vc the (100) plane, and the vectors Vc and Va the (010) plane. The angle α made by the vectors Va and Vb and the angle γ made by the vectors Vb and Vc are 90 degrees, and the angle β made by the vectors Vc and Va is 103.7 degrees. For indicating the inclination angle $A_{OFF}$ of the wafer primary surface 11a, the wafer primary surface 11a is represented by a chain line in FIG. 2 (b). With this wafer 11, since gallium oxide is the monoclinic system, an epitaxial layer with an excellent morphology can be grown on the wafer primary surface 11a by virtue of the inclination to the [001] axis.

In step S102 shown in FIG. 1, a laminate structure including a plurality of Group III nitride films is formed to fabricate an epitaxial wafer. The Group III nitride films are grown, for example, by the metal-organic vapor phase epitaxy (MOVPE) process or the like.

First, as shown in FIG. 1 (b), the wafer 11 is loaded into a susceptor in a growth reactor 10. Then, as shown in FIG. 1 (c), a buffer layer 13 is grown on the primary surface 11a of the wafer 11. The buffer layer 13 comprises, for example, a Group III nitride, such as GaN. When the buffer layer 13 is made of GaN, a source gas G0 containing trimethylgallium (TMG) and ammonia ($NH_3$) is supplied into the growth reactor 10. A growth temperature T1 of the buffer layer 13 is, for example, in the range of not less than 400 Celsius degrees and not more than 600 Celsius degrees, and the buffer layer 13 is so called a low-temperature buffer layer. The thickness of the buffer layer 13 can be, for example, in the range of not less than 10 nanometers and not more than 50 nanometers. Next, the temperature of the growth reactor 10 is increased to a temperature T2 higher than the growth temperature T1 and thereafter, as shown in FIG. 1 (d), an epitaxial layer 15 comprises a first gallium nitride based semiconductor and is grown on a primary surface 13a of the buffer layer 13. The epitaxial layer 15 comprises, for example, a hexagonal Group III nitride, such as GaN, AlGaN, InGaN, or AlN. The thickness of the epitaxial layer 15 can be, for example, in the range of not less than 300 nanometers and not more than 10 micrometers. When the epitaxial layer 15 comprises GaN, a source gas G1 containing trimethylgallium (TMG) and ammonia ($NH_3$) is supplied into the growth reactor 10. For example, in the growth of GaN, the growth temperature T2 of the epitaxial layer 15 is in the range of not less than 900 Celsius degrees and not more than 1200 Celsius degrees, and the epitaxial layer 15 is a semiconductor layer constituting a gallium nitride based semiconductor device, which can be applied as one which is undoped, or doped with a p-type dopant or with an n-type dopant. For imparting p-type conductivity or n-type conductivity to the epitaxial layer 15, a dopant gas is also supplied in addition to the source gas during the growth of the epitaxial layer 15. The dopant to be used can be, for example, cyclopentadienyl magnesium ($Cp_2Mg$) for the p-type conductivity and, for example, silane ($SiH_4$) for the n-type conductivity.

The deposition of gallium nitride based semiconductors up to the above steps results in obtaining an epitaxial wafer E. The epitaxial wafer E includes the gallium oxide wafer 11, the buffer layer 13, and the epitaxial layer 15.

In the epitaxial wafer E, when the range of inclination of the wafer primary surface 11a is not less than 2 degrees and not more than 4 degrees relative to the (100) plane of monoclinic gallium oxide, a normal $VN_E$ to a primary surface 15a of the epitaxial layer 15 makes an angle of not more than 1 degree relative to the c-axis of the gallium nitride based semiconductor of the epitaxial layer 15. Epitaxially growing the gallium nitride based semiconductor on the monoclinic gallium oxide substrate with an inclination of the wafer primary surface 11a can improve the morphology of the surface of the epitaxial layer, and an angle $AE_{OFF}$ between the normal vector $VN_E$ and a vector VC indicative of the c-axis of the gallium nitride based semiconductor of the epitaxial layer 15, is reduced to not more than 1 degree.

In the epitaxial wafer E, flatness of the primary surface 15a of the epitaxial layer 15 is reduced to surface roughness (RMS) of not more than 0.5 nm in the area 5 micrometers square. This surface roughness is measured with an atomic force microscope (AFM).

In step S103 shown in FIG. 1, a number of electrodes are formed on the epitaxial wafer E. With reference to FIG. 3 (a), a first electrode 17a is formed on the primary surface 15a of the epitaxial layer of the epitaxial wafer E. The first electrode 17a is, for example, a Schottky electrode, and this Schottky electrode comprises, for example, gold (Au). The first electrode 17a makes a Schottky junction 19 with the epitaxial layer. A second electrode 17b is formed on the back surface 11b of the gallium oxide substrate of the epitaxial wafer E. The second electrode 17b is, for example, an ohmic electrode. Carrying out steps S101 to S103 results in fabricating a gallium nitride based semiconductor device shown in FIG. 3 (a). This gallium nitride based semiconductor device includes a Schottky junction diode.

If necessary, the epitaxial wafer E can include a gallium nitride based semiconductor layer or a number of gallium nitride based semiconductor layers grown in order on the epitaxial layer 15. These gallium nitride based semiconductor layers are grown, for example, by the metal-organic vapor phase epitaxy process in step S102.

With reference to FIG. 3 (b), the epitaxial wafer E can include, for example, another epitaxial layer 23 grown on the epitaxial layer 15. The epitaxial layer 15 is undoped or n-type conductive, and the epitaxial layer 23 comprises a p-type gallium nitride based semiconductor layer. The epitaxial layer 23 makes a pn junction 25 with the epitaxial layer 15. A first electrode 27a is formed on a primary surface 23a of the epitaxial layer of the epitaxial wafer E. The first electrode 27a includes, for example, a p-ohmic electrode. The second electrode 17b is formed on the back surface 11b of the gallium oxide substrate of the epitaxial wafer E. Carrying out steps S101 to S103 results in fabricating a gallium nitride based semiconductor device shown in FIG. 3 (b). This gallium nitride based semiconductor device includes a pn junction diode.

The epitaxial wafer according to the present embodiment can provide gallium nitride based semiconductor laminate structures for light emitting devices, transistors, and other devices, as described below, as well as that for the pn junction diode.

Example 1

Eleven monoclinic gallium oxide substrates are prepared. The primary surfaces of these gallium oxide substrates are inclined in the range of not less than 0 degrees and not more than 5 degrees relative to the (100) plane of the single crystal of the gallium oxide substrates. Intervals of the inclination angles were 0.5 degrees. The direction of inclination is the direction of the [001] axis in the single crystal of the gallium oxide substrates. The inclination angles and inclination directions are determined by the X-ray diffraction method.

In order to investigate a relation between inclination angles (off angles) of the substrate primary surfaces of the gallium oxide substrates and morphologies of surfaces of GaN epitaxial films, a GaN buffer layer and a GaN epitaxial film are grown on these gallium oxide substrates, as described below, by the MOVPE process. Each gallium oxide substrate is placed in a growth reactor and thereafter a source gas containing $NH_3$, TMG, and $SiH_4$ is supplied into the growth reactor to grow a low-temperature GaN buffer layer on the gallium oxide substrate at the temperature of 500 Celsius degrees. The thickness of the GaN buffer layer is 25 nanometers. Next, the substrate temperature is changed to 1050 Celsius degrees, and then a source gas containing $NH_3$, TMG, and $SiH_4$ is supplied into the growth reactor to grow a GaN epitaxial layer on the buffer layer. The thickness of the GaN epitaxial layer is 3 micrometers.

The same epitaxial growth is carried out with all the gallium oxide substrates prepared, to fabricate eleven epitaxial wafers. FIG. 4 is a drawing showing the relation between inclination angles (off angles) of substrate primary surfaces of the gallium oxide substrates and morphologies of surfaces of the GaN epitaxial films.

FIG. 5 is a drawing showing a scanning electron microscope image indicating a surface of an epitaxial wafer using the gallium oxide substrate with the off angle of zero. The scale shown in FIG. 5 indicates 10 μm. As shown in FIG. 5, steps-like level differences of about several micrometers are formed in the GaN epitaxial film on the gallium oxide substrate with the off angle of zero or with a small off angle, and, for this reason, the surface roughness of the GaN epitaxial film is large. On the other hand, terrace-like flat regions are formed between the step-like level differences. The surface morphology demonstrates the appearance of so-called terraced fields. For this reason, in order to evaluate the surface roughness (RMS) with the atomic force microscope, surface roughness is measured at different positions on a surface of a GaN epitaxial film and thereafter a maximum of these measurements is determined.

The low-temperature GaN buffer layer is grown at several film formation temperatures in the temperature range of not less than 400 Celsius degrees and not more than 600 Celsius degrees and thereafter the GaN epitaxial layer is grown on this low-temperature GaN buffer layer under the aforementioned film formation condition. All of these epitaxial wafers demonstrate the same morphology as the wave-like morphology as shown in FIG. 5. Therefore, it is considered that the scanning electron microscope image of the epitaxial film at the off angle of 0 degrees is not attributed to the film formation temperature of the buffer layer, but is attributed to the zero off angle of the primary surface of the gallium oxide substrate. In the fabricate of the epitaxial wafers shown in FIG. 4, the low-temperature GaN buffer layer is grown at a temperature of 500 Celsius degrees.

The surface roughness is defined in the area 5 micrometers square with an atomic force microscope. With reference to FIG. 4, the surface roughness and off angle of epitaxial film decrease once as the off angle of the primary surface of the gallium oxide substrate increases from the just (100) plane. However, the surface roughness and off angle of epitaxial film increase with increase in the off angle of the primary surface of the gallium oxide substrate in the off angle range of more than 3 degrees. The surface roughness and surface morphology are drastically improved in the angle range near the off angle of 3 degrees.

When the off angle of the substrate surface is in the range of not less than 1.5 degrees and not more than 4.5 degrees, the surface roughness is not more than 1.3. When the off angle of the substrate surface is in the range of not less than 2.0 degrees and not more than 4.0 degrees, the surface roughness is less than 0.5 (or not more than 0.47). Furthermore, when the off angle of the substrate surface is in the range of not less than 2.5 degrees and not more than 3.5 degrees, the surface roughness is not more than 0.35. According to Inventors' investigation, the surface roughness values in the off angle range of not less than 2.0 degrees and not more than 4.0 degrees are in a satisfactorily permissible value range, in comparison to the surface roughness of a GaN epitaxial film on a sapphire substrate being 0.20 nanometer, in fabricate of semiconductor light emitting devices and semiconductor electronic devices. When the off angle is in the range of not less than 2.5 degrees and not more than 3.5 degrees, degradation of device characteristics due to the surface morphology is reduced.

Furthermore, the angle between the direction of the c-axis in the GaN epitaxial film and the normal axis to the surface of the GaN epitaxial film is estimated by the X-ray diffraction method. When the off angle of the substrate surface is in the range of not less than 1.5 degrees and not more than 4.5 degrees, the off angle of the GaN film is not more than 1.5 degrees. When the off angle of the substrate surface is in the range of not less than 2.0 degrees and not more than 4.0 degrees, the off angle of the GaN film was less than 1 degree (or not more than 0.9 degrees). Furthermore, when the off angle of the substrate surface is in the range of not less than 2.5 degrees and not more than 3.5 degrees, the off angle of the GaN film was not more than 0.6 degrees. According to Inventors' investigation, when the off angle of the gallium oxide substrate is from 2 degrees to 4 degrees, the off angle of the GaN epitaxial film is less than 1 degree, which enables epitaxial growth with excellent surface flatness.

If a multilayer film of a multi-quantum well structure is grown on a GaN epitaxial film with large step-like level differences or large surface roughness, uniformity of composition and thickness of well layers will be disordered. For this reason, there appears characteristic degradation such as reduction in emission intensity or increase in full width at half maximum of an emission spectrum. When a GaN epitaxial film with large step-like level differences or large surface roughness is used for a high-voltage device, there is a possibility of reduction in device reverse voltage due to nonuniformity of electric field or the like.

As described above with reference to the example, when the inclination angle is in the angle range of not less than 2 degrees and not more than 4 degrees throughout the entire primary surface of the gallium oxide substrate, the epitaxial wafer E allows the excellent morphology in the epitaxial film to be created throughout the entire primary surface of the epitaxial wafer E. When the inclination angle of the primary surface of the gallium oxide wafer is in the inclination angle range of not less than 2.5 degrees and not more than 3.5 degrees relative to the (100) plane of monoclinic gallium oxide, we can obtain the primary surface of the epitaxial layer with higher flatness.

The present example describes the epitaxial wafer including the GaN film, but Inventors' investigation confirms that the contribution of the off angle of the primary surface of the gallium oxide substrate is not limited only to GaN but the epitaxial film on the primary surface of the gallium oxide substrate could comprise any one of AlGaN, InGaN, InAlGaN, AlN, and so on. Therefore, this epitaxial wafer E is applicable to gallium nitride based semiconductor devices.

Figure 6:
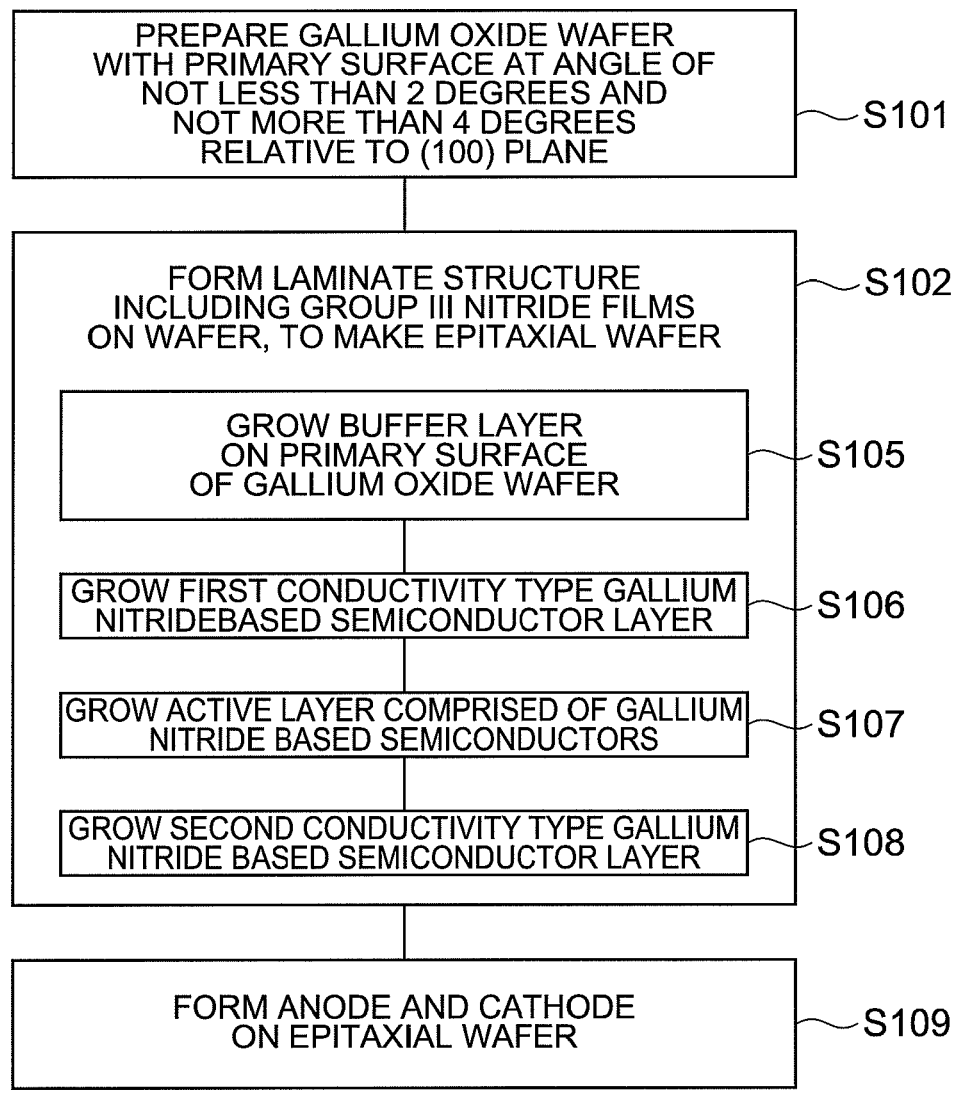
FIG. 6 is a drawing showing major steps of a method for fabricating a gallium nitride based semiconductor device and an epitaxial wafer according to an embodiment of the present invention.

FIG. 6 is a drawing showing major steps of a method for fabricating a gallium nitride based semiconductor device and an epitaxial wafer according to an embodiment of the present invention. In the flowchart shown in FIG. 6, in step S101, a gallium oxide wafer 11 with a primary surface is prepared and the gallium oxide wafer 11 is comprised of monoclinic gallium oxide. In step S102, a laminate structure is formed to fabricate an epitaxial wafer and the laminate structure includes plural Group III nitride films. The growth of Group III nitride films is carried out, for example, by the metalorganic vapor phase epitaxy (MOVPE) process or the like. In this embodiment, the laminate structure formed is different from that shown in FIG. 1 (d). In the same manner as in FIG. 2 (b), in step S105 the wafer 11 is placed on the susceptor in the growth reactor 10. Next, the buffer layer 13 is grown on the primary surface 11a of the wafer 11.

The temperature of the growth reactor 10 is increased to the temperature T2 higher than the growth temperature T1 and thereafter, in step S106 a first conductivity type epitaxial layer is grown on the primary surface 13a of the buffer layer 13. This epitaxial layer is comprised of a gallium nitride based semiconductor. The first conductivity type epitaxial layer is comprised, for example, of a hexagonal Group III nitride such as n-type GaN, n-type AlGaN, n-type InAlGaN, or n-type InAlN. When the first conductivity type epitaxial layer is comprised of GaN, a source gas containing TMG, $NH_3$, and $SiH_4$ is supplied into the growth reactor 10, to grow an n-type GaN film. When the first conductivity type epitaxial layer is comprised of GaN, the growth temperature T2 of the first conductivity type epitaxial layer is, for example, in the range of not less than 900 Celsius degrees and not more than 1200 Celsius degrees, and the first conductivity type epitaxial layer is a semiconductor layer constituting a gallium nitride based semiconductor device.

Next, in step S107, an active layer is formed on the first conductivity type epitaxial layer. The active layer includes well layers and barrier layers, which are arranged alternately. The well layers are comprised, for example, of GaN, InGaN, InAlGaN, or the like. The barrier layers are comprised, for example, of GaN, InGaN, InAlGaN, or the like. The growth temperature of the well layers is, for example, in the range of not less than 500 Celsius degrees and not more than 900 Celsius degrees, and the growth temperature of the barrier layers, for example, in the range of not less than 550 Celsius degrees and not more than 950 Celsius degrees.

After the above step, in step S108, a second conductivity type epitaxial layer is formed on the active layer. The second conductivity type epitaxial layer can include, for example, a p-type electron block layer and a p-type contact layer.

The growth of the gallium nitride based semiconductors up to the above steps results in obtaining an epitaxial wafer. The epitaxial wafer includes the gallium oxide wafer 11, and the semiconductor lamination grown on the gallium oxide wafer 11. This semiconductor lamination includes the first conductivity type epitaxial layer, the second conductivity type epitaxial layer, and the active layer, and the active layer is provided between the first conductivity type epitaxial layer and the second conductivity type epitaxial layer.

In step S109, the epitaxial wafer is etched to form a semiconductor mesa. This etching removes a part of the semiconductor lamination to expose a part of the first conductivity type epitaxial layer in the semiconductor lamination. After this epitaxial wafer processing, a first electrode is formed on the exposed part of the conductivity type epitaxial layer, and a second electrode is formed on the top surface of the semiconductor mesa. These steps result in fabricating a substrate product for a gallium nitride based semiconductor light emitting device.

Example 2

Figure 7:
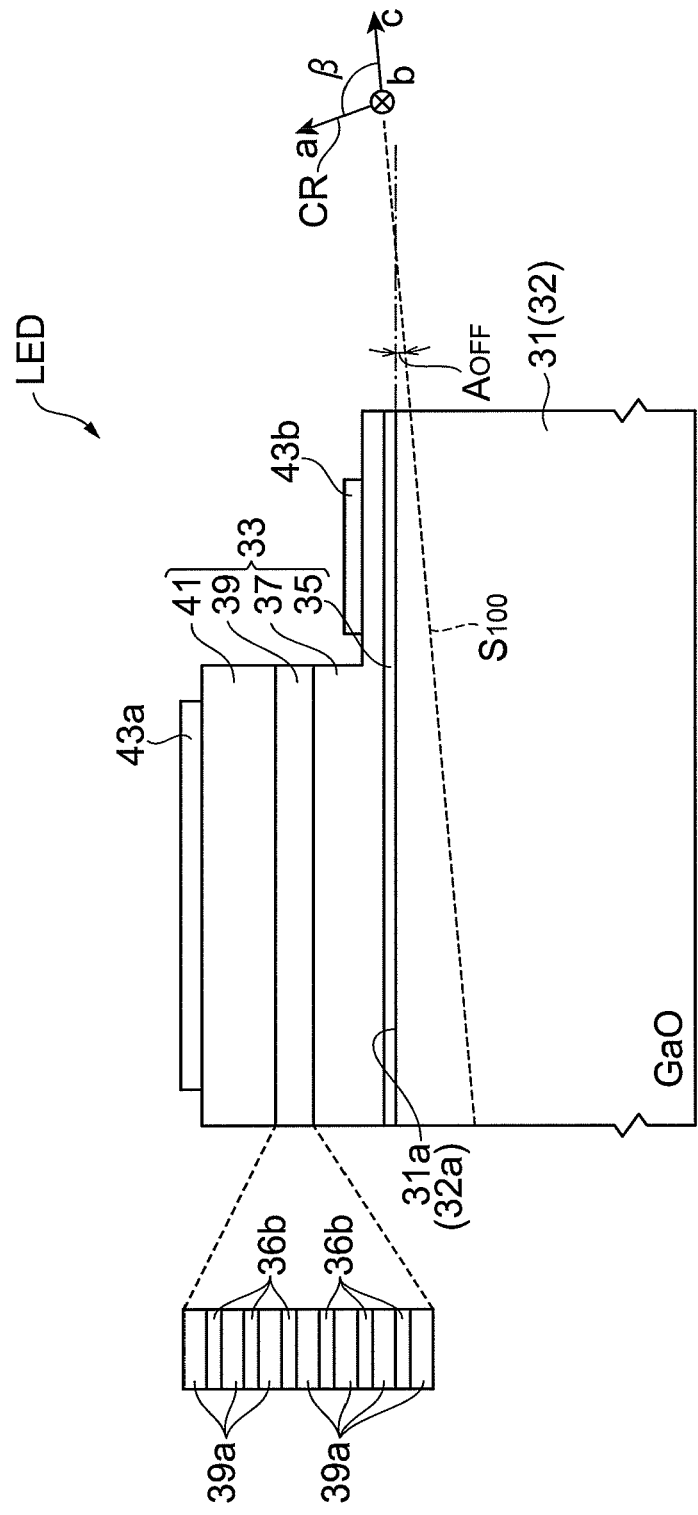
FIG. 7 is a drawing showing a structure of a light emitting diode in Example 2.

FIG. 7 is a drawing showing a structure of a light emitting diode in Example 2. The light emitting diode LED is provided with a gallium oxide support base 31 having a primary surface which comprises monoclinic gallium oxide, and a laminate structure 33 which comprises Group III nitrides. The laminate structure 33 has a semiconductor mesa shape. The semiconductor mesa includes a low-temperature GaN buffer layer 35, an n-type GaN layer 37, an active layer 39 of a quantum well structure, and a p-type gallium nitride based semiconductor layer 41. The p-type gallium nitride based semiconductor layer 41 includes, for example, a p-type AlGAn electron block layer and a p-type GaN contact layer.

An example of LED structure is as follows.
low-temperature GaN buffer layer 35: 25 nanometers;
n-type GaN layer 37: 3 micrometers;
active layer 39: MQW with six well layers,
barrier layers 39a: GaN layers, 15 nm thick;
well layers 39b: InGaN layers, 3 nm thick;
p-type AlGaN electron block layer of gallium nitride based semiconductor layer 41: 20 nm;
p-type GaN contact layer of gallium nitride based semiconductor layer 41: 50 nm.

Eleven monoclinic gallium oxide substrates are prepared in the same manner as in Example 1, and the primary surfaces of these gallium oxide substrates are inclined in the range of not less than 0 degrees and not more than 5 degrees relative to the (100) plane of the single crystal of the gallium oxide substrates. Intervals of angles of inclination were 0.5 degrees. The direction of inclination is the [001] axis direction of the single crystal of the gallium oxide substrates. The inclination angles and directions are determined by the X-ray diffraction method.

In order to investigate a relation between inclination angles (off angles) of the substrate primary surfaces of the gallium oxide substrates with morphologies and electroluminescences of surfaces of GaN epitaxial films, the LED structure is formed on these gallium oxide substrates, as described above, by the MOVPE process. A p-side electrode is formed on the top surface of the semiconductor mesa in this LED structure and an n-side electrode was formed on the exposed region of the n-type semiconductor.

The measurement of surface roughness is carried out in the area 5 micrometers square with an atomic force microscope. With reference to FIG. 8, the surface roughness and off angle of the semiconductor layer used as an underlying layer for growth of the active layer decrease once as the off angle of the primary surface of the gallium oxide substrate increases from the just (100) plane. However, in the off angle range of more than 3 degrees, the surface roughness and off angle of the epitaxial film increase with increase in the off angle of the primary surface of the gallium oxide substrate. In the angle range near the off angle of 3 degrees, the surface roughness and morphology are drastically improved.

When the off angle of the substrate surface is in the range of not less than 1.5 degrees and not more than 4.5 degrees, the surface roughness is not more than 1.3. When the off angle of the substrate surface is in the range of not less than 2.0 degrees and not more than 4.0 degrees, the surface roughness was less than 0.5 (e.g., not more than 0.47). Furthermore, when the off angle of the substrate surface was in the range of not less than 2.5 degrees and not more than 3.5 degrees, the surface roughness was not more than 0.35. According to Inventors' investigation, the surface roughness values in the off angle range of not less than 2.0 degrees and not more than 4.0 degrees are in a satisfactorily permissible range in the fabrication of light emitting diodes, in comparison to the surface roughness of the GaN epitaxial film on the sapphire substrate whose value is 0.20 nanometer. When the off angle is in the range of not less than 2.0 degrees and not more than 4.0 degrees, degradation of the emission property due to the morphology is reduced.

Furthermore, the angle between the normal axis to the surface of the GaN epitaxial film and the direction of the c-axis in the epitaxial film used as an underlying layer for growth of the active layer is estimated by the X-ray diffraction method. When the off angle of the substrate surface is in the range of not less than 1.5 degrees and not more than 4.5 degrees, the off angle of the GaN film is not more than 1.5 degrees. When the off angle of the substrate surface is in the range of not less than 2.0 degrees and not more than 4.0 degrees, the off angle of the GaN film was less than 1 degree (e.g., not more than 0.9 degrees). Furthermore, when the off angle of the substrate surface is in the range of not less than 2.5 degrees and not more than 3.5 degrees, the off angle of the GaN film is not more than 0.6 degrees. According to Inventors' investigation, when the off angle of the gallium oxide substrate is from 2 degrees to 4 degrees, the off angle of the GaN epitaxial film becomes less than 1 degree, which enables the epitaxial growth with excellent surface flatness.

Furthermore, a power supply is connected between the n-side electrode and one of p-side electrodes (electrode size: e.g., 0.4 mm×0.4 mm) arrayed on a substrate product, and a forward bias is applied to the light emitting diode LED. The light output at the applied current of 20 mA is measured. When the off angle of the substrate surface is in the range of not less than 1.5 degrees and not more than 4.5 degrees, the light output was not less than 3.1 mW. When the off angle of the substrate surface is in the range of not less than 2.0 degrees and not more than 4.0 degrees, the light output is not less than 4.3 mW. Furthermore, when the off angle of the substrate surface is in the range of not less than 2.5 degrees and not more than 3.5 degrees, the light output is not less than 4.7 mW. When the off angle of the gallium oxide substrate is from 2 degrees to 4 degrees, the light output from the LED structure in the present example is about 80% of the light output from the same LED structure fabricated on a sapphire substrate; therefore, this LED structure demonstrates the excellent emission property.

This light emitting diode LED includes the laminate structure 33 for the light emitting device provided on the gallium oxide support base 31 separated from a gallium oxide substrate 32. This separation can prevent the characteristics of the light emitting diode LED from being troubled by poor flatness of the epitaxial surface, thus providing the light emitting diode LED with the excellent emission property.

Figure 9:
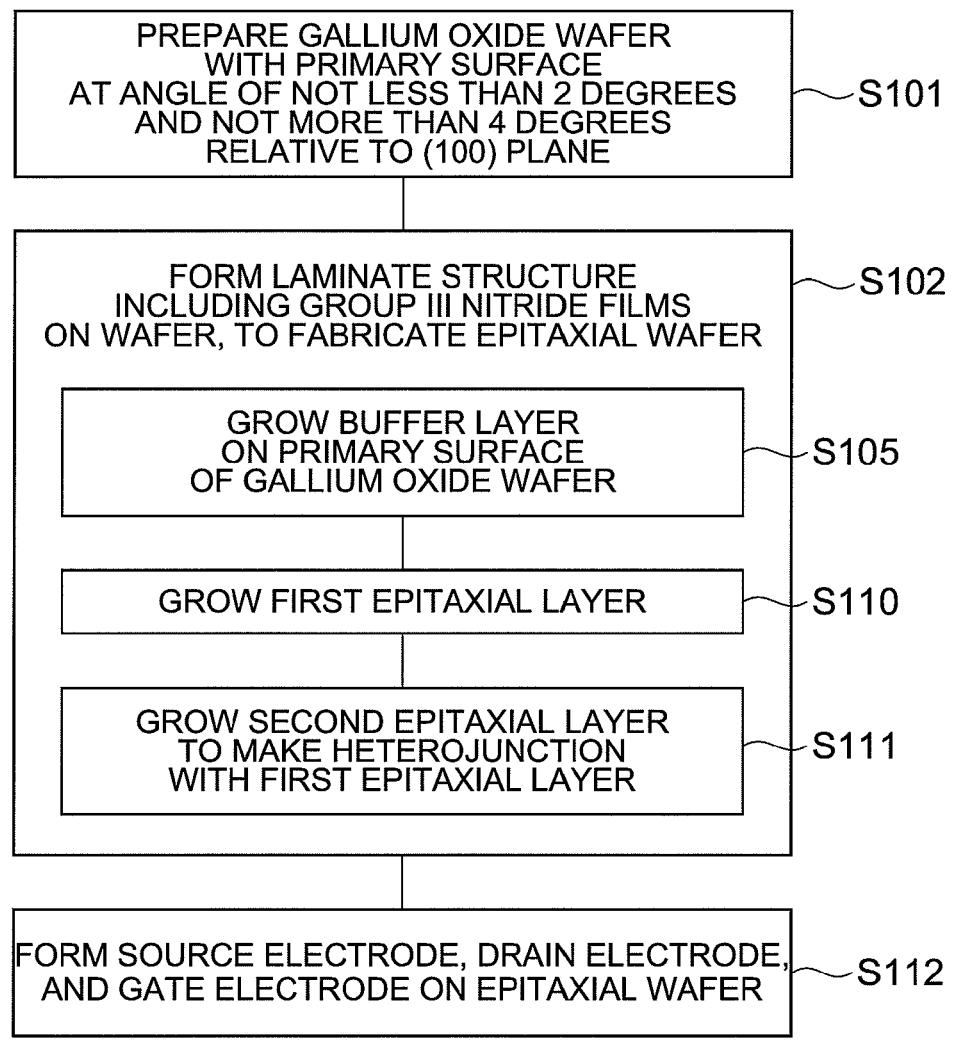
FIG. 9 is a drawing showing major steps of a method for fabricating a high electron mobility transistor and an epitaxial wafer according to an embodiment of the present invention.
Figure 10:
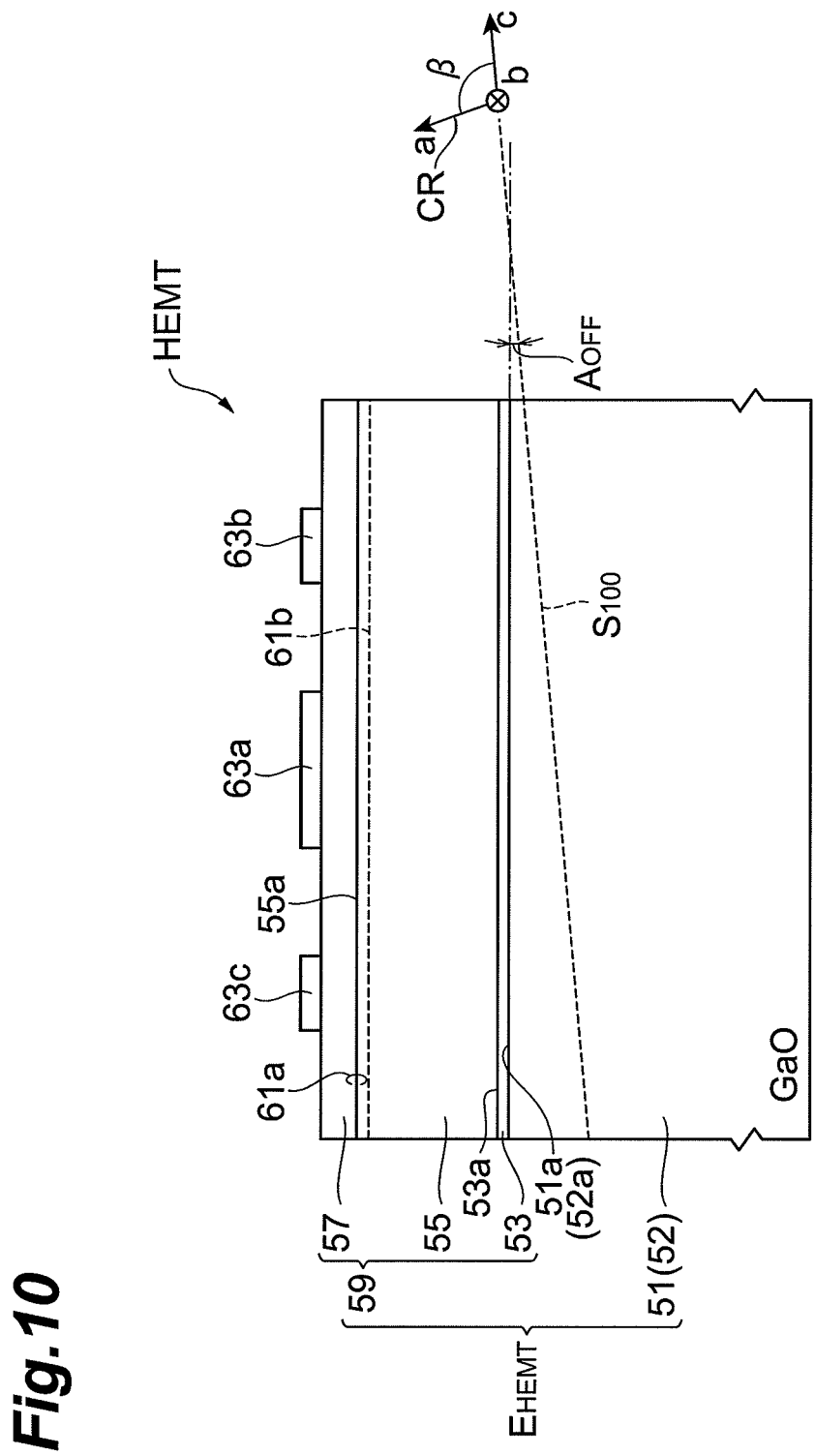
FIG. 10 is a drawing schematically showing the high electron mobility transistor and the epitaxial wafer fabricated according to the step flow of FIG. 9.

FIG. 9 is a drawing showing major steps of a method for fabricating a high electron mobility transistor and an epitaxial wafer for this device, according to an embodiment of the present invention. FIG. 10 is a drawing schematically showing the high electron mobility transistor and the epitaxial wafer fabricated in accordance with the step flow of FIG. 9. In the flowchart shown in FIG. 9, in step S101, a gallium oxide wafer 51 is prepared, and the gallium oxide wafer 51 has a primary surface comprised of monoclinic gallium oxide. In step S105, the wafer 51 is placed on the susceptor in the growth reactor, as in FIG. 2 (b). Then a low-temperature buffer layer 53 is grown on a primary surface 51a of the wafer 51. The temperature of the growth reactor is increased to the temperature T2 higher than the growth temperature T1 of the buffer layer 53 and thereafter, in step S110 an epitaxial layer 55 is grown on a primary surface 53a of the buffer layer 53. This epitaxial layer 55 comprises a gallium nitride based semiconductor. The epitaxial layer 55 comprises for example, a hexagonal Group III nitride, such as undoped GaN, undoped AlGaN, undoped InAlGaN, or undoped InGaN. When the epitaxial layer 55 is made of GaN, a source gas containing TMG and $NH_3$ is supplied into the growth reactor to grow an undoped GaN film. When the epitaxial layer 55 is made of GaN, the growth temperature T2 of the epitaxial layer 55 is, for example, in the range of not less than 900 Celsius and not more than 1200 Celsius. Subsequently, in step S111 another epitaxial layer 57 is grown on a primary surface 55a of the epitaxial layer 55. This epitaxial layer 57 is made of a gallium nitride based semiconductor and the bandgap of the epitaxial layer 57 is larger than that of the epitaxial layer 55. The epitaxial layer 57 is made, for example, of a hexagonal Group III nitride such as undoped GaN, undoped AlGaN, undoped InAlGaN, or undoped InAlN. When the epitaxial layer 57 is made of AlGaN, a source gas containing trimethylaluminum (TMA), TMG, and $NH_3$ is supplied into the growth reactor to grow an undoped AlGaN film. When the epitaxial layer 57 is made of AlGaN, the growth temperature of the epitaxial layer 57 is, for example, in the range of not less than 900 Celsius degrees and not more than 1300 Celsius degrees. The epitaxial layer 57 makes a heterojunction 61a with the epitaxial layer 55 and a two-dimensional electron gas layer 61b is created along the heterojunction 61a in the epitaxial layer 55. These steps result in obtaining an epitaxial wafer $E_{HEMT}$ for a high electron mobility transistor HEMT.

In step S112, a gate electrode 63a, a source electrode 63b, and a drain electrode 63c is formed on the epitaxial wafer $E_{HEMT}$. The gate electrode 63a includes a Schottky electrode, and the source electrode 63b and drain electrode 63c include ohmic electrodes. The gate electrode 63a changes the electron density of the channel created along the heterojunction 61a, depending upon its gate voltage, to control an electric current flowing from the drain electrode 63c to the source electrode 63b.

This high electron mobility transistor HEMT includes a laminate structure 59 provided on a gallium oxide support base 52 separated from the gallium oxide substrate 51. Since a primary surface 52a of the gallium oxide support base 52 is inclined at the aforementioned angle, the epitaxial layer 57 with a flat surface is provided owing to the inclination. The inclination can prevent the characteristics of the high electron mobility transistor HEMT comprising the gallium nitride based semiconductors from being troubled by poor flatness of the epitaxial surface.

Figure 11:
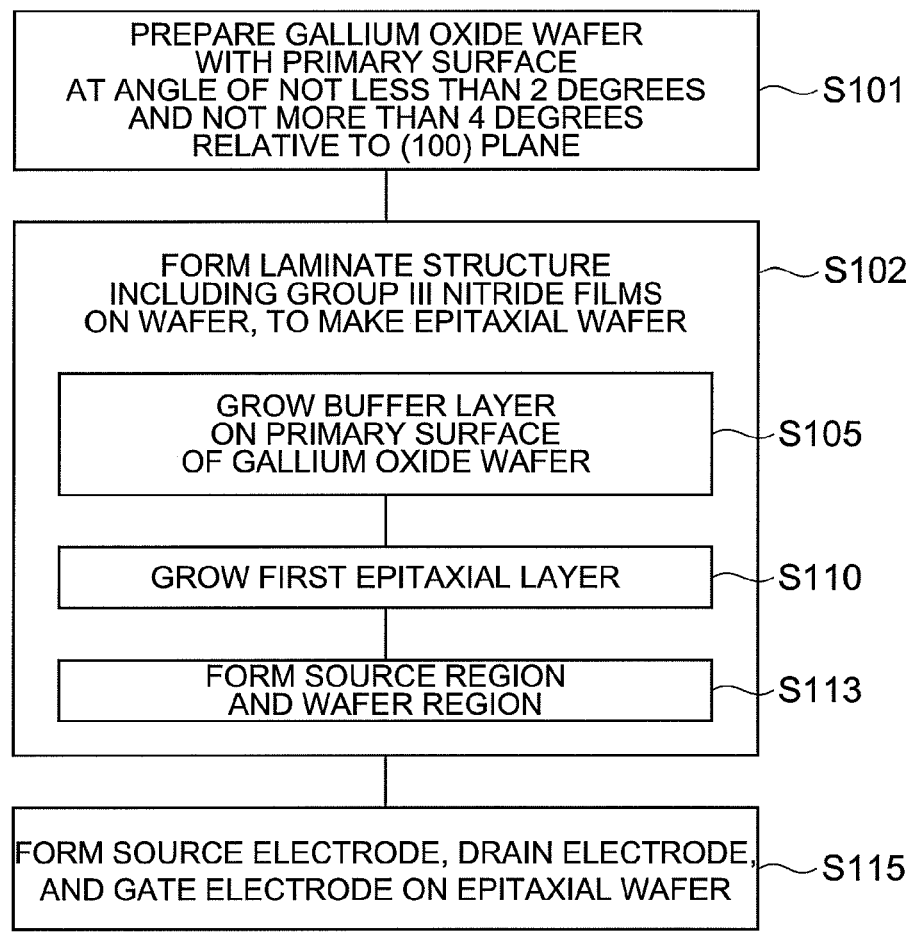
FIG. 11 is a drawing showing major steps of a method for fabricating a vertical field effect transistor and an epitaxial wafer according to an embodiment of the present invention.

FIG. 11 is a drawing showing major steps of a method for fabricating a vertical field effect transistor and an epitaxial wafer according to an embodiment of the present invention. FIG. 12 is a drawing schematically showing the vertical field effect transistor and the epitaxial wafer fabricated according to the step flow of FIG. 11. In the flowchart shown in FIG. 11, in step S101, the gallium oxide wafer 51 prepared and the gallium oxide wafer 51 has a primary surface comprising monoclinic gallium oxide. In step S105, the wafer 51 is placed on the susceptor in the growth reactor, as in FIG. 2 (b). Next, the low-temperature buffer layer 53 is grown on the primary surface 51a of the wafer 51. The temperature of the growth reactor is increased to the temperature T2 higher than the growth temperature T1 of the buffer layer 53 and thereafter, in step S110 an epitaxial layer 65 is grown on the primary surface 53a of the buffer layer 53. This epitaxial layer 65 comprises a gallium nitride based semiconductor. The epitaxial layer 65 is made, for example, of a hexagonal Group III nitride such as n-type GaN, n-type AlGaN, n-type InAlGaN, or n-type InAlN. When the epitaxial layer 65 is made of n-type GaN, a source gas containing TMG, $NH_3$, and $SiH_4$ is supplied into the growth reactor to grow an n-type GaN film. The majority carrier of the n-type GaN film is electrons. When the epitaxial layer 55 is made of GaN, the growth temperature of the epitaxial layer 65 is, for example, in the range of not less than 900 Celsius degrees and not more than 1200 Celsius degrees. Subsequently, in step S113, an n-type source semiconductor region 67 and a p-type well semiconductor region 69 are formed on a surface of the epitaxial layer 65. This formation can be performed by photolithography, etching, selective growth, etc. and the n-type source semiconductor region 67 and the p-type well semiconductor region 69 comprise, for example, gallium nitride based semiconductors such as GaN. The n-type source semiconductor region 67 is isolated from the epitaxial layer 65 by the p-type well semiconductor region 69. One end of the p-type well semiconductor region 69 is exposed in a surface of a semiconductor lamination 71. These steps result in obtaining an epitaxial wafer $E_{FET}$ for a vertical field effect transistor FET.

In step S115, a gate electrode 75a is formed on an insulating film 73 at one end of the p-type well semiconductor region 69, and a source electrode 75b is formed on the n-type source semiconductor region 67, and a drain electrode 75c is formed on the back surface of the wafer 51. The gate electrode 75a forms a surface inversion layer 77 on the insulating film 73 at one end of the p-type well semiconductor region 69 to control an electric path between the epitaxial layer 65 of n-type drift layer region and the n-type source semiconductor region 67 depending upon the gate voltage.

This vertical field effect transistor FET includes the laminate structure 59 provided on the gallium oxide support base 52 separated from the gallium oxide substrate 51. Since the primary surface 52a of the gallium oxide support base 52 is inclined at the aforementioned angle, the epitaxial layer 65 with a flat surface is provided owing to the inclination. The inclination can prevent the characteristics of the vertical field effect transistor FET comprising the gallium nitride based semiconductors from being troubled by poor flatness of the epitaxial surface.

Having illustrated and described the principle of the present invention in the preferred embodiments, it is recognized by those skilled in the art that the present invention can be modified in arrangement and details without departing from the principle. The present invention is by no means limited to the specific configurations disclosed in the embodiments. Therefore, we claim all modifications and changes falling within the scope of claims and resulting from the scope of spirit thereof.

LIST OF REFERENCE SIGNS

11 . . . gallium oxide wafer;
11a . . . primary surface of gallium oxide wafer;
11b . . . surface of gallium oxide wafer;
$A_{OFF}$ . . . angle;
$S_{100}$ . . . (100) plane;
13 . . . buffer layer;
15 . . . epitaxial layer;
$VN_E$ . . . normal;
VC . . . c-axis vector;
$AE_{OFF}$ . . . angle;
17a, 17b . . . electrodes;
E . . . epitaxial wafer;
23 . . . epitaxial layer;
25 . . . pn junction;
27a, 27b . . . electrodes;
31 . . . gallium oxide support base;
32 . . . gallium oxide substrate;
33 . . . laminate structure;
35 . . . low-temperature GaN buffer layer;
37 . . . n-type GaN layer;
39 . . . active layer;
39a . . . barrier layers;
39b . . . well layers;
41 . . . gallium nitride based semiconductor layer;
51 . . . wafer;
52 . . . gallium oxide support base;
53 . . . buffer layer;
55 . . . epitaxial layer;
57 . . . epitaxial layer;
61a . . . heterojunction;
61b . . . two-dimensional electron gas layer;
$E_{HEMT}$ . . . epitaxial wafer;
63a . . . gate electrode;
63b . . . source electrode;
63c . . . drain electrode;
59 . . . laminate structure;
65 . . . epitaxial layer;
67 . . . n-type source semiconductor region;
69 . . . p-type well semiconductor region;
71 . . . semiconductor lamination;
$E_{FET}$ . . . epitaxial wafer;
73 . . . insulating film;
75a . . . gate electrode;
75b . . . source electrode;
75c . . . drain electrode.

The invention claimed is:

1. An epitaxial wafer for a gallium nitride based semiconductor device, comprising:
 a gallium oxide wafer with a primary surface, the primary surface comprising monoclinic gallium oxide;
 a buffer layer provided on the primary surface of the gallium oxide wafer, the buffer layer comprising a Group III nitride; and
 a first epitaxial layer provided on the buffer layer, the first epitaxial layer comprising a first gallium nitride based semiconductor,
 the primary surface of the gallium oxide wafer being inclined at an angle of not less than 2 degrees and not more than 4 degrees relative to a (100) plane of the monoclinic gallium oxide.

2. The epitaxial wafer according to claim 1, wherein a direction of inclination of the primary surface of the gallium oxide wafer is a direction of a [001] axis of the monoclinic gallium oxide.

3. The epitaxial wafer according to claim 1, wherein a crystal structure of the first gallium nitride based semiconductor is a hexagonal crystal, and
 wherein a normal to a primary surface of the first epitaxial layer makes an angle of not more than 1 degree relative to a c-axis of the first gallium nitride based semiconductor.

4. The epitaxial wafer according to claim 1, wherein surface roughness (RMS) in a primary surface of the first epitaxial layer is not more than 0.5 nm in an area 5 micrometers square.

5. The epitaxial wafer according to claim 1, wherein the first gallium nitride based semiconductor comprises GaN.

6. The epitaxial wafer according to claim 1, wherein the first gallium nitride based semiconductor comprises AlGaN.

7. The epitaxial wafer according to claim 1, wherein the first gallium nitride based semiconductor comprises InGaN.

8. The epitaxial wafer according to claim 1, wherein the first gallium nitride based semiconductor comprises AlN.

9. The epitaxial wafer according to claim 1, wherein the buffer layer comprises GaN.

10. The epitaxial wafer according to claim 1, wherein the angle of inclination is distributed in the primary surface of the gallium oxide substrate and is in an angle range of not less than 2 degrees and not more than 4 degrees throughout an entire primary surface of the gallium oxide substrate.

11. The epitaxial wafer according to claim 1, wherein the primary surface of the gallium oxide wafer is inclined at an angle of not less than 2.5 degrees and not more than 3.5 degrees relative to the (100) plane of the monoclinic gallium oxide.

12. A gallium nitride based semiconductor device comprising:
 a gallium oxide support base having a primary surface, the primary surface comprising monoclinic gallium oxide; and
 a laminate structure comprising a Group III nitride material,
 the laminate structure including a buffer layer and a first epitaxial layer, the buffer layer being provided on the primary surface of the gallium oxide support base and comprising a Group III nitride, and the first epitaxial layer being provided on the buffer layer and comprising a first gallium nitride based semiconductor, and
 the primary surface of the gallium oxide support base being inclined at an angle of not less than 2 degrees and not more than 4 degrees relative to a (100) plane of the monoclinic gallium oxide.

13. The gallium nitride based semiconductor device according to claim 12, wherein the laminate structure further comprises a second epitaxial layer and an active layer, the second epitaxial layer is provided on the buffer layer and comprises a second gallium nitride based semiconductor, and the active layer is provided between the first epitaxial layer and the second epitaxial layer, wherein the gallium oxide wafer has conductivity, wherein the first epitaxial layer has a first conductivity type, wherein the second epitaxial layer has a second conductivity type opposite to the first conductivity type, and wherein the active layer has a quantum well structure, wherein the gallium nitride based semiconductor device includes a semiconductor light emitting device.

14. The gallium nitride based semiconductor device according to claim 12, wherein the laminate structure further comprises a second epitaxial layer provided on the gallium oxide support base, wherein the second epitaxial layer makes a heterojunction with the first epitaxial layer, wherein a bandgap of the second gallium nitride based semiconductor is larger than a bandgap of the first gallium nitride based semiconductor, and wherein the heterojunction creates a two-dimensional electron gas at an interface between the first epitaxial layer and the second epitaxial layer, wherein the gallium nitride based semiconductor device includes a two-dimensional electron gas transistor.

15. The gallium nitride based semiconductor device according to claim 12, further comprising:

a source region comprising a gallium nitride based semiconductor region of a first conductivity type; and a well region comprising a gallium nitride based semiconductor region of a second conductivity type, the well region isolating the source region from the first epitaxial layer, the gallium oxide support base having conductivity, a conductivity type of the first epitaxial layer being the first conductivity type, and the gallium nitride based semiconductor device including a vertical field effect transistor.

16. The gallium nitride based semiconductor device according to claim 12, wherein surface roughness (RMS) in a primary surface of an uppermost layer of the laminate structure is not more than 0.5 nm in a 5-micrometer square area.

17. A method for fabricating a gallium nitride based semiconductor device, comprising the steps of:

preparing a gallium oxide wafer with a primary surface, the primary surface comprising monoclinic gallium oxide;

growing a buffer layer of a Group III nitride on the primary surface of the gallium oxide wafer; and growing a first epitaxial layer of a first gallium nitride based semiconductor on the buffer layer, the primary surface of the gallium oxide wafer being inclined at an angle of not less than 2 degrees and not more than 4 degrees relative to a (100) plane of the monoclinic gallium oxide.

18. The method according to claim 17, wherein a growth temperature of the buffer layer is not less than 400 Celsius degrees and not more than 500 Celsius degrees.

19. A gallium oxide wafer with a primary surface comprising monoclinic gallium oxide, the primary surface of the gallium oxide wafer being inclined at an angle of not less than 2 degrees and not more than 4 degrees relative to a (100) plane of the monoclinic gallium oxide.

20. The gallium oxide wafer according to claim 19, wherein a direction of inclination of the primary surface of the gallium oxide wafer is a direction of a [001] axis of the monoclinic gallium oxide.

* * * * *